(12) United States Patent
Park et al.

(10) Patent No.: US 8,241,375 B1
(45) Date of Patent: Aug. 14, 2012

(54) METHOD FOR PREPARING CHEMICAL MECHANICAL POLISHING SLURRY COMPOSITION

(75) Inventors: Jong-Dai Park, Hwaseong-Si (KR); Dong-Wan Kim, Hwaseong-Si (KR)

(73) Assignee: Dongjin Semichem Co., Ltd., Incheon (KR)

( * ) Notice: Subject to any disclaimer, the term of this patent is extended or adjusted under 35 U.S.C. 154(b) by 0 days.

(21) Appl. No.: 13/433,041

(22) Filed: Mar. 28, 2012

Related U.S. Application Data

(63) Continuation of application No. 12/314,714, filed on Dec. 16, 2008, which is a continuation-in-part of application No. 11/153,624, filed on Jun. 16, 2005, now abandoned, and a continuation-in-part of application No. 11/317,076, filed on Dec. 27, 2005, now abandoned.

(30) Foreign Application Priority Data

Jun. 18, 2004 (KR) .................. 10-2004-0045639
Mar. 14, 2005 (KR) .................. 10-2005-0021083

(51) Int. Cl.
B24D 3/02 (2006.01)
C09C 1/68 (2006.01)
C09K 3/14 (2006.01)

(52) U.S. Cl. ............................. 51/307; 51/309

(58) Field of Classification Search .......... 51/307, 51/309
See application file for complete search history.

(56) References Cited

U.S. PATENT DOCUMENTS

| 2,888,501 | A * | 5/1959 | Carr et al. ............. 585/740 |
| 5,221,497 | A * | 6/1993 | Watanabe et al. ......... 516/83 |
| 6,280,490 | B1 * | 8/2001 | Rader et al. ............ 51/307 |
| 2004/0006924 | A1 * | 1/2004 | Scott et al. ............ 51/307 |
| 2005/0121377 | A1 * | 6/2005 | Koga et al. ........... 210/198.1 |

FOREIGN PATENT DOCUMENTS

JP 08208235 A * 8/1996

* cited by examiner

*Primary Examiner* — Jessica L Ward
*Assistant Examiner* — Ross J Christie
(74) *Attorney, Agent, or Firm* — Kile Park Goekjian Reed & McManus PLLC

(57) ABSTRACT

A method for preparing a chemical mechanical polishing slurry composition comprises the steps of preparing an aqueous iron salt solution by admixing an iron salt and cooled water of 5° C. or less; preparing an oxide containing silicon and iron as an additive by admixing and stirring a silicon salt and the aqueous iron salt solution for carrying out a reaction of the silicon salt and the aqueous iron salt solution to form an additive solution; and mixing the additive solution with at least one abrasive, at least one oxidizing agent and optionally at least one additional component to form the chemical mechanical polishing slurry composition.

12 Claims, 4 Drawing Sheets

METHOD FOR PREPARING CHEMICAL MECHANICAL POLISHING SLURRY COMPOSITION

This application is a continuation application of U.S. patent application Ser. No. 12/314,714, filed Dec. 16, 2008, which is a continuation-in-part application of U.S. application Ser. Nos. 11/153,624 and 11/317,076 filed Jun. 16, 2005 and Dec. 27, 2005 respectively, which claim priorities to and benefits of Korean Patent Application Nos. 10-2004-0045639 and 10-2005-0021083 filed on Jun. 18, 2004 and Mar. 14, 2005 respectively, the contents of which are incorporated herein by reference in their entireties.

FIELD OF THE INVENTION

This invention relates to a method for preparing a chemical mechanical polishing (CMP) slurry composition. The CMP slurry composition not only uniformly and effectively polishes a metal layer but also reduces defect formations on a polished surface in a semiconductor manufacturing process.

BACKGROUNDS OF THE INVENTION

An integrated semiconductor chip includes a large number of electrical elements, such as transistors, capacitors, resistors and so on, and the electrical elements are connected with conductive metal layers of certain patterns to form functional circuits. The size of the integrated semiconductor chip becomes smaller and the functionality thereof becomes being magnified over several generations. To increase the integration degree of the semiconductor chip, the size of the electrical elements may be reduced. However, there is an inherent limitation in reducing the size of the electrical elements. Thus, a multilevel interconnection technology of the electrical elements has been actively studied and developed. In manufacturing a semiconductor device with the multilevel interconnection technology, a planarization process of a metal layer is indispensable. The metal layer is not easily polished due to its relatively high strength, and therefore, the metal layer should be converted into a metal oxide layer having a relatively low strength for effective polishing of the metal layer.

CMP slurry compositions for such polishing of a metal layer were disclosed in Korean Patent Laid-open Nos. 2004-29239, 2004-35073, 2004-35074 and 2004-55042. However, the CMP slurry compositions disclosed in the above-mentioned references have a disadvantage of not providing sufficient chemical conversion of the metal layer into a metal oxide layer. From 1876, Fenton's reagent, which is a composition composed with hydrogen peroxide and iron salt, is conventionally used for oxidizing a metal layer. However, in the method, an excess amount of iron salt, such as $Fe(NO_3)_3$ is necessary, and the excess iron salt may badly influences the metal layer to be polished. Accordingly, it is necessary to develop a CMP slurry composition which effectively oxidizes the metal layer and does not produce defects on the polished metal layer.

SUMMARY OF THE INVENTION

Therefore, it is an object of the present invention to provide a method for preparing a chemical mechanical polishing (CMP) slurry composition. It is other object of the present invention to provide a method for preparing a CMP slurry composition which is useful for uniform polishing of a metal layer. It is another object of the present invention to provide a method for preparing a CMP slurry composition which is capable of reducing defect formations on a polished metal layer, wherein defects are generally formed on the polished metal layer by a metal salt such as an iron salt in a conventional CMP slurry composition.

To achieve these and other objects, the present invention provides a method for preparing a CMP slurry composition. The method includes the steps of: preparing an aqueous iron salt solution by admixing an iron salt and cooled water of 5° C. or less; and preparing an oxide containing silicon and iron as an additive by admixing and stirring a silicon salt and the aqueous iron salt solution for carrying out a reaction of the silicon salt and the aqueous iron salt solution. In the additive solution, the amount of the additive (namely, the oxide containing silicon and iron) is 0.1 to 20 weight % with respect to the total additive solution.

DETAILED DESCRIPTION OF THE INVENTION

Figure 1A:
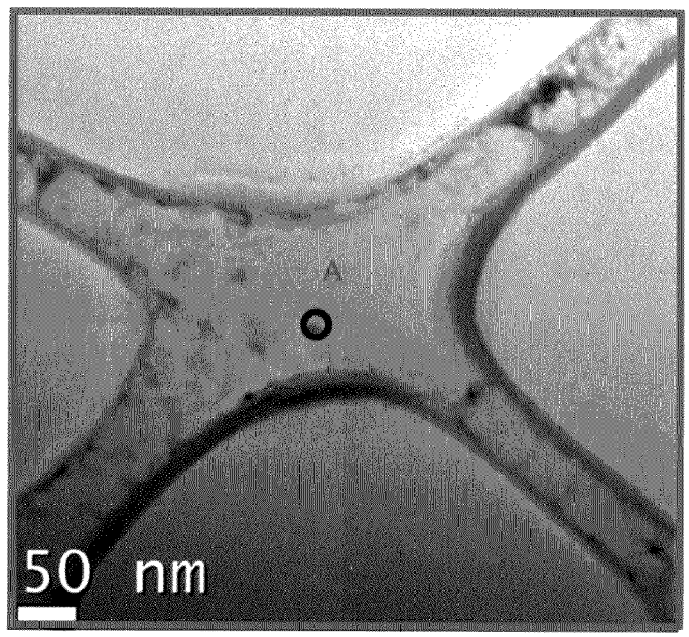
FIG. 1a is a HR-TEM (High Resolution Transmission Electron Microscope) photograph of an additive particle produced according to an embodiment of the present invention.

A more complete appreciation of the invention, and many of the attendant advantages thereof, will be better appreciated by reference to the following detailed description.

The additive of the present invention is useful for preparing a CMP slurry composition. In order to prepare the additive according to an embodiment of the present invention, first, an aqueous iron salt solution is prepared by admixing an iron salt and cooled water of 5° C. or less. The preferable water for this step is water from which impurities, such as metal ion, are removed, and the more preferable water is deionized water. The temperature of water is 5° C. or less, preferably 3° C. or less, and more preferably 0 to 1° C. If the temperature of the water is more than 5° C., in the next reaction step of silicon salt and the iron salt solution, the particle size of the produced additive may become undesirably larger due to the exothermic reaction of silicon salt and the iron salt solution. Various compounds which can produce iron ion in water can be used as the iron salt. The representative examples of the iron salt include $FeCl_3$, $Fe(NO_3)_3$, $Fe_2(SO_4)_3$, $Fe_2(C_2O_4)_3$ and mixture thereof. The concentration of the iron salt in the aqueous iron salt solution is 0.1 to 50.0 mol %, and preferably 0.1 to 20.0 mol % with respect to the total aqueous iron salt solution. If the concentration of the iron salt is less than 0.1 mol %, in the next reaction step of silicon salt and the iron salt solution, the additive may not be sufficiently produced. If the concentration of the iron salt is more than 50.0 mol %, in the next reaction step of silicon salt and the iron salt solution, the amount of the silicon salt becomes relatively small, and therefore the additive may not be produced.

Then, a silicon salt is slowly and dropwisely added to the produced aqueous iron salt solution, and stirred for carrying out a reaction of the silicon salt and the aqueous iron salt solution to produce an oxide containing silicon and iron in aqueous solution. Various compounds which can produce colloidal silica by a reaction with water can be used as the silicon salt. The silicon salt produces silicon ion in water. The representative example of the silicon salt includes $SiCl_4$. The amount of the silicon salt is preferably controlled so that the amount of Si contained in the silicon salt is 2 to 10 times of the amount of Fe contained in the iron salt by the mole ratio. If the amount of Si is less than 2 times or more than 10 times of Fe by mole ratio, the additive may not be properly formed. The temperature of the silicon salt, which will be added to the aqueous iron salt solution, is preferably maintained at $-10°$ C. or less, and more preferably maintained at $-20°$ C. or less. The reaction of the silicon salt and the iron salt solution can be carried out at $5°$ C. or less, preferably $3°$ C. or less, and more preferably carried out at $-3°$ C.~$1°$ C. If the temperature of the silicon salt, which will be added to the aqueous iron salt solution, is more than $-10°$ C., the vaporization of the silicon salt may occur. If the reaction temperature of the silicon salt and the iron salt solution is more than $5°$ C., in the reaction step of silicon salt and the iron salt solution, the particle size of the produced additive may become undesirably larger due to the exothermic reaction of silicon salt and the iron salt solution. The iron salt and silicon salt can be used without any pre-treatment.

After adding the silicon salt to the aqueous iron salt solution, it is preferable to remove ions, such as $Fe^{3+}$, $Cl^-$ etc, contained in the reaction solution so as to prevent the rapid growth of the produced colloidal additive particles. If the ions, such as $Fe^{3+}$, $Cl^-$, are removed from the reaction solution, the ionic strength of the reaction solution is reduced, and the reaction solution is stabilized. The removal of ions in the reaction solution can be carried out by dialyzing the reaction solution. For example, the reaction solution can be dialyzed with a membrane at room temperature.

In the produced additive solution, iron (Fe) does not exist in an ion state, but iron (Fe) exists in the form of oxide particle with the silicon atom. In the additive solution, the size of the additive (i.e., oxide particle) can be varied according to the process (polishing) conditions. Generally, the size(diameter) of the single additive particle (first particle) is preferably 3 to 10 nm. The size of the second particle formed by the aggregation of the first particles is preferably 10 to 100 nm. If the size of the oxide (additive particle) is too small, the polishing efficiency can be lowered because of the defective bonding of iron(Fe), silicon(Si) and oxygen(O). If the size of the oxide (additive particle) is too large, scratches can be formed on the surface of the substrate to be polished. The amount of the additive in the aqueous additive solution can be varied according to the CMP process conditions, additive manufacturing conditions, etc. The preferable amount of the additive in the aqueous additive solution is 0.1 to 20 weight % with respect to the total aqueous additive solution.

The additive solution produced according to an embodiment of the present invention is preferably stored at the low temperature of about $4°$ C., and admixed with other components of a CMP slurry composition just before carrying out the polishing of a metal layer. Alternatively, the additive solution can be pre-mixed with other components of a CMP slurry composition, and stored or delivered at low temperature for the future polishing process. Conventionally, the components of a CMP slurry composition capable of being mixed with the additive solution of the present invention include an abrasive, an oxidizing agent, an oxidizing assistant, a dispersion stabilizer, and so on. Exemplary abrasive suitable for the present invention includes $\alpha$-alumina, $\gamma$-alumina, fumed silica, colloidal silica, ceria (cerium oxide) and the mixture thereof. The amount of the abrasive is preferably 0.1 to 20.0 weight % with respect to the total of CMP slurry composition. If the amount of the abrasive is less than 0.1 weight %, it is difficult to mechanically polish the metal layer to be polished, and if the amount of the abrasive is more than 20.0 weight %, the dispersion stability thereof can be lowered. The amount of the additive solution in the CMP slurry composition is preferably 0.0001 to 5.0 weight %, and more preferably 0.0001 to 3.0 weight % with respect to the total CMP slurry composition. If the amount of the additive solution is less than 0.0001 weight %, it is difficult to obtain the desirable polishing effects, and if the amount of the additive solution is more than 5.0 weight %, a lot of defects can be formed on the polished metal layer due to the excessive aggregation of the additives.

The CMP slurry composition including the additive solution according to an embodiment of the present invention further includes a conventional oxidizing agent. Examples of the oxidizing agent include hydrogen peroxide, peroxydicarbonate, octanoyl peroxide, acetylbenzoyl peroxide and the mixtures thereof. The amount of the oxidizing agent is preferably 0.1 to 5.0 weight % with respect to the total CMP slurry composition. If the amount of the oxidizing agent is less than 0.1 weight %, an oxide layer may not be effectively formed. If the amount of the oxidizing agent is more than 5.0 weight %, the polishing efficiency can be increased, but the excess oxidation power may induce the polishing defects. In a polishing slurry composition for a metal layer, a degradation inhibitor is conventionally used to prevent a degradation of the oxidizing agent. However, in the present invention, the degradation inhibitor is not necessary because metal ions (Fe ion, Cu ion, Mn ion, Ti ion, etc.) do not exist in the polishing slurry composition. The remaining component of the polishing slurry composition is water, and preferably deionized water. In addition, if necessary, the polishing slurry composition further includes a pH modifier, a dispersing agent, a buffer solution and so on. The CMP slurry composition including the additive of the present invention includes no or a very little iron ion. Therefore, the defects possibly generated during the polishing process of a metal layer can be minimized, and process stability and manufacturing yield of the CMP process are excellent.

Hereinafter, preferable example is provided for better understanding of the present invention. However, the present invention is not limited to the following example.

EXAMPLE 1

Preparation of Additive Solution

Deionized water was cooled to $1°$ C., and $FeCl_3$ was added into the deionized water with active stirring so that the concentration of $FeCl_3$ became 20 mol %. To the solution, $SiCl_4$, which was kept at $-20°$ C. or less, was slowly and dropwisely added and stirred to prepare a colloidal solution. The amount of $SiCl_4$ was controlled so that the amount of Si in the $SiCl_4$ is 4 times of the amount of Fe in the $FeCl_3$ by the mole ratio. $Fe^{3+}$, $Cl^-$ ions contained in the colloidal solution were dialyzed with Spectra/Por membrane (MWCO(molecular weight cut off): 6000-8000) at room temperature in order to prevent the rapid growth of particles in the final colloidal solution and to stabilize the particles. The dialysis was carried out until the pH of the solution became 3 or less, and therefore the ionic strength of the solution decreases. The obtained additive solution was kept at the temperature of 4° C.

EXAMPLES 2-4

Polishing Test of CMP Slurry Composition

CMP slurry compositions including 80 g of fumed silica ($SiO_2$), 200 g of hydrogen peroxide, the additive solution produced in Example 1 and of the amount shown in Table 1, 1914.8 g of deinoized water were prepared (Examples 2-4). In addition, a comparative CMP slurry composition without the additive prepared in Example 1 (Comparative example 1) and a comparative CMP slurry composition including 0.3 g of iron nitrate ($Fe(NO_3)_3$) Instead of the additive prepared in Example 1 (Comparative example 2) were prepared.

PETEOS (plasma enhanced tetraethyl orthosilicate) precursor was deposited with CVD(Chemical Vapor Deposition) method, and tungsten metal layer of 0.8 μm thickness are formed to produce a 8-inch blanket wafer (PETEOS-500 nm, W-800 nm). The wafer was polished with the prepared CMP slurry composition, and the polishing results are set forth in Table 1. The polishing were carried out with a polishing equipment "Unipla 211" (Manufacturer: Doosan Mecatec Co., Ltd. Republic of Korea) and a polishing pad "IC1000/suba IV(k-groove, 22.5 inches, Manufacturer: Rom & Hass company, U.S.A.). The polishing conditions were as follows: 40 rpm of platen speed, 40 rpm of head speed, 7 psi of down pressure, 200 ml/min of slurry flow rate and 60 seconds of polishing time.

TABLE 1

| | Abrasive | Amount of Additive solution (g) | Amount of hydrogen peroxide(g) | Removal Rate of wafer 1 (Å/min) | Removal Rate of wafer 2 (Å/min) | Polishing Non-uniformity (%) |
|---|---|---|---|---|---|---|
| Example 2 | $SiO_2$ | 8.2 | 200 | 2653 | 2830 | 6.3 |
| Example 3 | $SiO_2$ | 0.82 | 200 | 524 | 528 | 1.6 |
| Example 4 | $SiO_2$ | 82 | 200 | 3112 | 2972 | 12.1 |
| Comparative Example 1 | $SiO_2$ | 0 | 200 | 79.2 | 79.5 | 1.4 |
| Comparative Example 2 | $Fe(NO_3)_3$ | 0.3 | 200 | 2390 | 2137 | 7.1 |

In Table 1, the Removal rates are measured for two wafers ("wafer 1" and "wafer 2") which are the same 8-inch blanket wafer prepared above. The "Polishing non-uniformity" in Table 1 was calculated by the following equation.

Polishing non-uniformity=(standard deviation of polishing rates/mean of polishing rates)*100

As shown in Table 1, the slurry composition having the additive solution according to an embodiment of the present invention includes a very little amount of Fe component, but the slurry composition produces similar "Removal rate" and "Polishing non-uniformity" compared with a conventional slurry composition including a large amount iron ion.

[Analysis 1] Analysis of the Additive Using HR-TEM Photograph

Figure 1B:
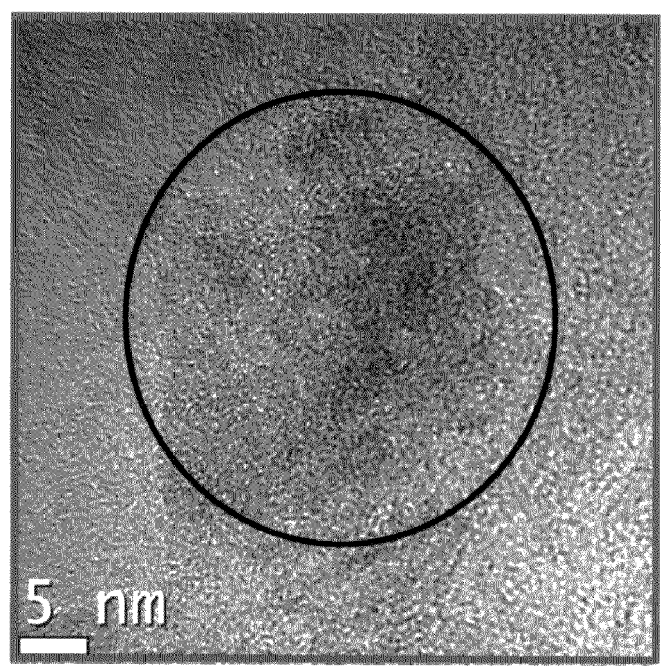
FIG. 1b is a HR-TEM (High Resolution Transmission Electron Microscope) photograph of aggregated additives produced according to an embodiment of the present invention.

A HR-TEM (High Resolution Transmission Electron Microscope) photograph of the additive particle of Example 1 was obtained with an instrument "TECNAI G2 Super Twin F20" (acceleration voltage: 200 kV, Manufacturer: FEI company, U.S.A.), and depicted in FIG. 1a (Magnification ratio: 40,000). The additive particle was produced by drying the additive solution of Example 1. In FIG. 1a, "A" indicates the additive particle and the size of the additive particle is about 4~5 nm. FIG. 1b is a HR-TEM (High Resolution Transmission Electron Microscope) photograph of aggregated additives(Magnification ratio: 400,000). In FIG. 1b, "B" indicates an area of the second particle which is formed by the aggregation of the first additive particles having the size of 3~10 nm. In FIG. 1b, the additive has a lattice structure of Fe—Si—O particle.

[Analysis 2] EDX analysis of Additive

Figure 2:
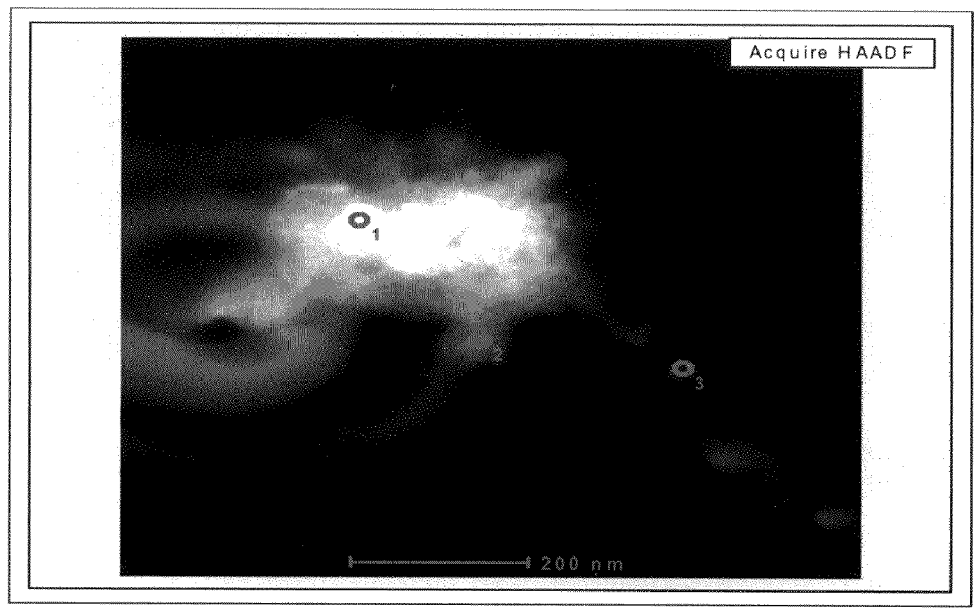
FIG. 2 is a TEM (Transmission Electron Microscope) photograph obtained by scanning aggregated additives produced according to an embodiment of the present invention with a HR-TEM EDX(Energy Dispersive X-ray spectrometer) HAADF(High Angle Annular Dark Field) detector.

In order to check the existence of Fe and Si components in the additive particle and outside of the additive particle, dried aggregated additives was scanned with a HR-TEM EDX(Energy Dispersive X-ray spectrometer) HAADF(High Angle Annular Dark Field) detector("Fischione model 3000HAADE", Manufacturer: Fischione Instruments. U.S.A.), and the obtained TEM (Transmission Electron Microscope) photograph is depicted in FIG. 2. Contrary to a HR-TEM CCD(High Resolution Transmission Electron Microscope Charge-Couple Device), in HAADF image of FIG. 2, the white area represents the aggregated additives.

Figure 3A:
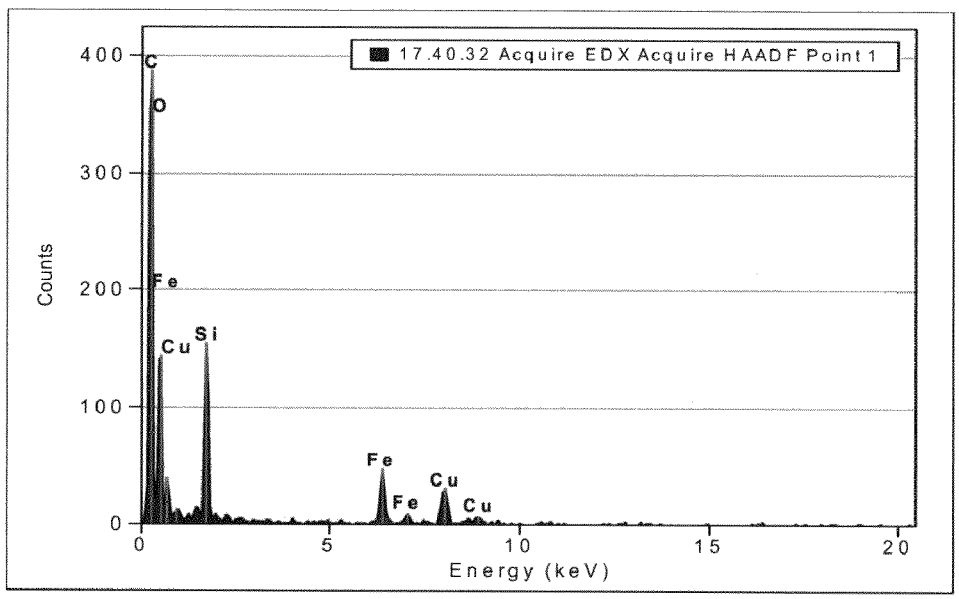
FIGS. 3a-3c are HR-TEM EDX graphs measured at local areas marked in FIG. 2 for analyzing the atomic components which exist in the local areas.
Figure 3B:
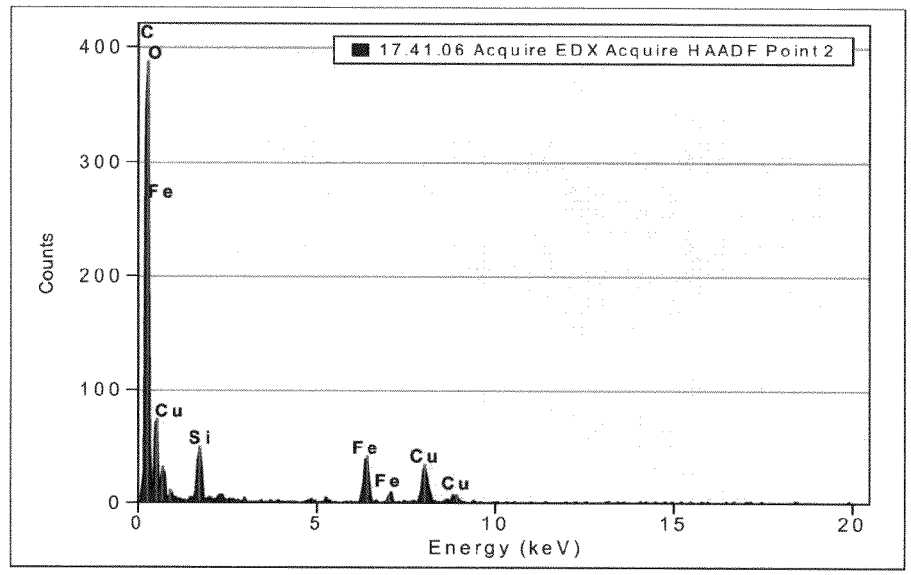
Figure 3C:
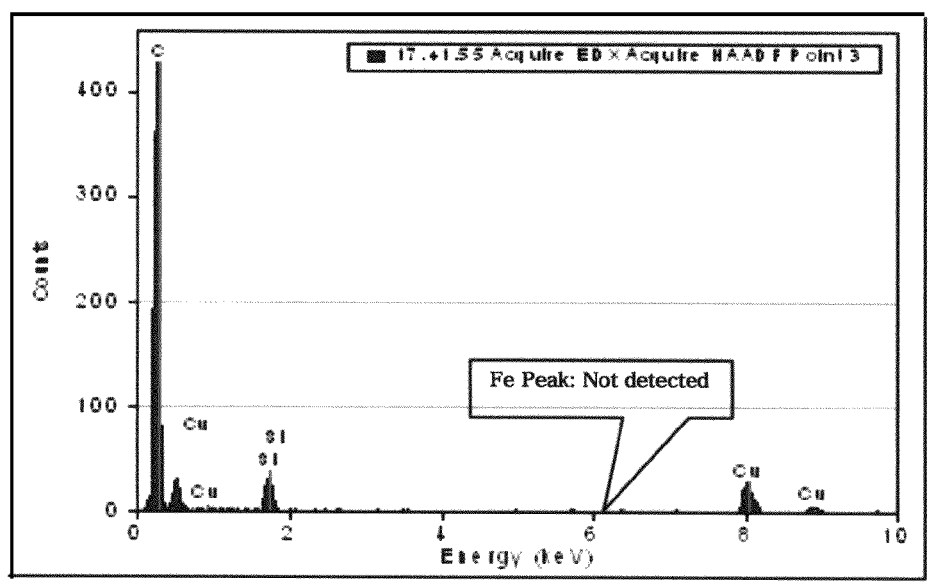

For analyzing the atomic components which exist in the local areas of FIG. 2, HR-TEM EDX (High Resolution-Transmission Electron Microscope Energy Dispersive X-ray spectrometer) graphs were measured at the local areas marked in FIG. 2, and are depicted in FIGS. 3a-3c. HR-TEM EDX is an instrument for analyzing atomic components by radiating X-ray to a sample so that K-shell electrons of an atom in the sample is excited to generate vacancies of $e^-$ at the K-shell, and by measuring a discharging energy when L-shell electrons or M-shell electrons of the atom move to the vacancies in K-shell.

FIGS. 3a-3c are graphs showing the measurement results of HR-TEM EDX at "Point 1", "Point 2" and "Point 3" in FIG. 2, respectively. In FIG. 3a and FIG. 3b, Fe component co-exists with Si component, and thus Fe and Si components coexist at "Point 1" (the area of additive particles) and at "Point 2" (the edge area of additive particles). However, Fe ion was not detected at "Point 3" (the area where there is a small amount of colloidal silica which is not reacted with Fe component). Therefore, it was confirmed that all Fe component was in the additive particles and the Fe component did not exist out of the additive particles.

[Analysis 3] XPS Analysis of Additive

Figure 4:
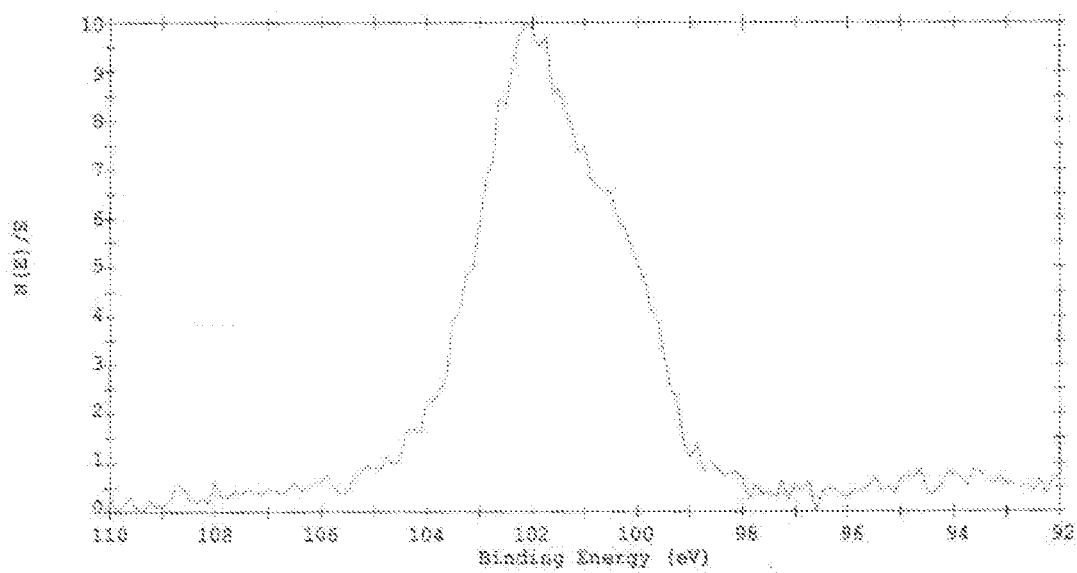
FIG. 4 is a binding energy graph of an additive particle produced according to an embodiment of the present invention, which is obtained by XPS (X-ray Photoelectron Spectroscopy).

A binding energy graph of the additive particle produced in Example 1 was obtained with XPS (X-ray Photoelectron Spectroscopy), and is shown in FIG. 4. The used XPS was PHI 5800 EC+SCA System (Manufacturer: Perkin-Elmer Inc. U.S.A.), and operated at the conditions of background pressure: $2 \times 10^{-10}$ torr, Source: Monochromator Al Ka(1486.6 eV) Anode(250 W, 10 kV, 27 mA), Spot size: 400 μm×400 μm. In FIG. 4, peaks corresponding to binding energies of Fe—Si—O were observed at 103.3 eV and 100.5 eV. Thus, it was confirmed that there is a Fe—Si—O bonds in the additive particle.

[Analysis 4] Iron Component Distribution Analysis Using Colorimetry

Figure 5:
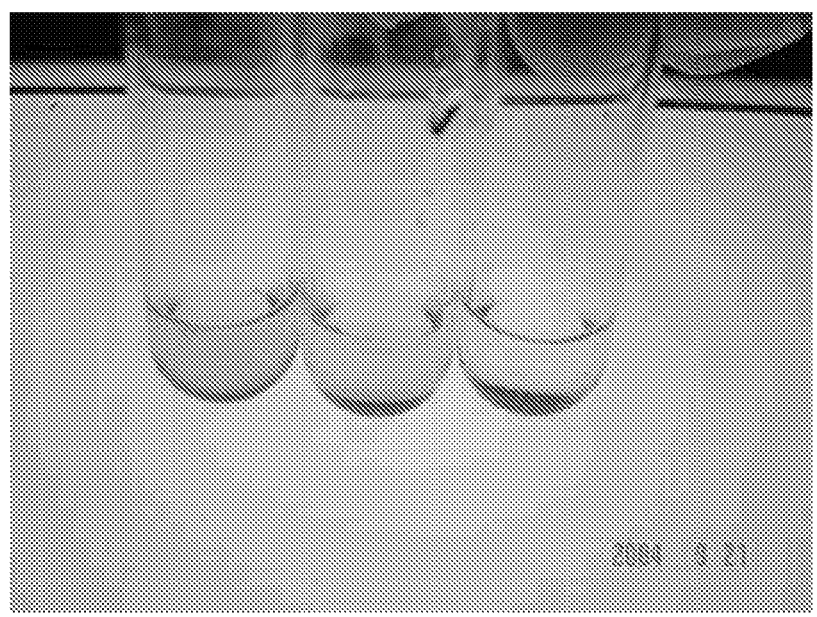
FIG. 5 is a photograph showing the colorimetry test results for detecting $Fe^{2+}$ ion in CMP slurry compositions.

A CMP slurry composition including 0.2 weight % of the additive solution obtained in Example 1, 6.0 weight % of fumed silica as an abrasive, and water as the remainder was prepared. A slurry composition including $Fe(NO_3)_3$ instead of the additive solution was also prepared. HCl/ferrozine indicator solution was added to each of the two slurry compositions and water (a blank solution) to detect $Fe^{2+}$ ion component, and the color of the samples were observed. The results are depicted in FIG. 5. As shown in FIG. 5, a color change by $Fe^{2+}$ ion is not detected from the slurry including the additive solution (left test tube in FIG. 5) and from the pure water (right test tube in FIG. 5), which means that the $Fe^{2+}$ ion does not exist in these solutions. On the contrary, a color change by $Fe^{2+}$ ion is detected from the slurry including $Fe(NO_3)_3$ (center test tube in FIG. 5), which means that the $Fe^{2+}$ ion exists in the solution.

The invention claimed is:

1. A method for preparing a chemical mechanical polishing slurry composition, comprising:
    preparing an aqueous iron salt solution by admixing an iron salt and cooled water of 5° C. or less;
    preparing an oxide containing silicon and iron as an additive by admixing and stirring a silicon salt and the aqueous iron salt solution for carrying out a reaction of the silicon salt and the aqueous iron salt solution to form an additive solution; and
    mixing the additive solution with at least one abrasive, at least one oxidizing agent and optionally at least one additional component to form the chemical mechanical polishing slurry composition.

2. The method for preparing a chemical mechanical polishing slurry composition of claim 1, wherein the iron salt is selected from the group consisting of $FeCl_3$, $Fe(NO_3)_3$, $Fe_2(SO_4)_3$, $Fe_2(C_2O_4)_3$ and mixture thereof.

3. The method for preparing a chemical mechanical polishing slurry composition of claim 1, wherein the silicon salt is $SiCl_4$.

4. The method for preparing a chemical mechanical polishing slurry composition of claim 1, wherein the concentration of the iron salt in the aqueous iron salt solution is 0.1 to 50.0 mol %.

5. The method for preparing a chemical mechanical polishing slurry composition of claim 1, wherein the amount of Si contained in the silicon salt is 2 to 10 times of the amount of Fe contained in the iron salt by mole ratio.

6. The method for preparing a chemical mechanical polishing slurry composition of claim 1, further comprising a step of removing ions contained in a reaction solution of the silicon salt and the aqueous iron salt solution.

7. The method for preparing a chemical mechanical polishing slurry composition of claim 6, wherein the step of removing ions is carried out by dialyzing the reaction solution of the silicon salt and the aqueous iron salt solution with a membrane.

8. The method for preparing a chemical mechanical polishing slurry composition of claim 1, wherein amount of the additive is 0.1 to 20 weight % with respect to the total additive solution.

9. The method for preparing a chemical mechanical polishing slurry composition of claim 1, wherein a particle size of the additive is 3 to 10 nm.

10. The method for preparing a chemical mechanical polishing slurry composition of claim 1, wherein the at least one abrasive is selected from the group consisting of α-alumina, γ-alumina, fumed silica, colloidal silica, ceria and mixtures thereof.

11. The method for preparing a chemical mechanical polishing slurry composition of claim 1, wherein the at least one oxidizing agent is selected from the group consisting of hydrogen peroxide, peroxydicarbonate, octanoyl peroxide, acetylbenzyl peroxide and mixtures thereof.

12. The method for preparing a chemical mechanical polishing slurry composition of claim 1, wherein the at least one addition component is selected from the group consisting of an oxidizing assistant, a dispersion stabilizer, a pH modifier, a dispersing agent, a buffer solution, and mixtures thereof.

* * * * *